US006781415B2

(12) United States Patent
Clark et al.

(10) Patent No.: US 6,781,415 B2
(45) Date of Patent: Aug. 24, 2004

(54) ACTIVE VOLTAGE LEVEL BUS SWITCH (OR PASS GATE) TRANSLATOR

(75) Inventors: Sean X. Clark, North Yarmouth, ME (US); James B. Boomer, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 83 days.

(21) Appl. No.: 10/301,465

(22) Filed: Nov. 21, 2002

(65) Prior Publication Data

US 2003/0098714 A1 May 29, 2003

Related U.S. Application Data

(60) Provisional application No. 60/335,650, filed on Nov. 27, 2001.

(51) Int. Cl.$^7$ .......................................... H03K 19/0175
(52) U.S. Cl. .......................... 326/81; 326/83; 326/121; 326/68; 327/112; 327/333
(58) Field of Search .............................. 326/80–83, 63, 326/68, 112, 119, 121; 327/111, 112, 333, 427, 434, 437, 546

(56) References Cited

U.S. PATENT DOCUMENTS

| | | | | |
|---|---|---|---|---|
| 5,381,062 A | * | 1/1995 | Morris | 326/68 |
| 5,751,168 A | | 5/1998 | Speed, III et al. | |
| 5,926,056 A | * | 7/1999 | Morris et al. | 327/333 |
| 6,005,432 A | | 12/1999 | Guo et al. | |
| 6,114,876 A | * | 9/2000 | Kwong et al. | 326/81 |
| 6,188,243 B1 | | 2/2001 | Liu et al. | |
| 6,504,418 B1 | | 1/2003 | Coughlin, Jr. | |

OTHER PUBLICATIONS

Notification of Transmittal of the International Search Report or the Declaration, Dated Apr. 10, 2003.

* cited by examiner

Primary Examiner—Vibol Tan
(74) Attorney, Agent, or Firm—Cesari and McKenna, LLP; Edwin H. Paul, Esq.

(57) ABSTRACT

A bi-direction voltage level translating switch that connects a higher voltage circuit to a lower voltage circuit without using a direction signal disclosed. The drive circuit for the gate of an MOS switch acts to clamp the lower voltage side of the translating switch limiting the lower voltage to a level compatible with the lower voltage circuitry connected to the lower voltage side. A pull up circuit is connected to the higher voltage side of the switch and further defines a threshold lower than the lower voltage. When the signal reaches the threshold the pull up circuit pull the higher voltage side up to the higher voltage. Again the drive on the gate of the switch prevents that higher voltage from reaching the lower voltage side. When the lower voltage side drives, through an on switch, the higher voltage side low, the pull up circuit is designed to be overcome by the lower voltage drive circuitry so that the higher voltage side goes low. When the threshold is reached going low the pull up circuitry is disabled. In a preferred embodiment, the pull up circuit provides a low impedance connection to the higher voltage to quickly drive the higher voltage side high, but the low impedance is active for a given amount of time, wherein the pull up circuitry reverts to a high impedance. The circuit is suitable for operating in virtually all computer systems including networked communications, displays, data bases, and the like.

10 Claims, 3 Drawing Sheets

ACTIVE VOLTAGE LEVEL BUS SWITCH (OR PASS GATE) TRANSLATOR

CROSS-REFERENCE TO RELATED APPLICATIONS

The present application claims the benefit of U.S. Provisional Patent Application Ser. No. 60/335,650, filed on Nov. 27, 2001, and of common title and inventorship as the present application. This provisional application is hereby incorporated by reference herein.

BACKGROUND OF THE INVENTION

1. Field of the Invention

The present application relates to bus switches and more particularly to bus switches that also translate from one voltage to another.

2. Background Information

Microprocessors and application specific integrated circuits and other such large scale integrated circuits often communication off chip via solid state switches, called bus switches. Due to the variety of circuit types available, e.g. TTL, LVTTL (also known as LVLS—low level logic signal), and even ECL, voltage translation is often combined or required in such bus switches.

FIG. 1 shows a known bus switch 2 that couples a high voltage node 4 to a low voltage node 6. The gate 8 of the bus switch 2 is driven by a PMOS 10 and an NMOS 12 in a push/pull arrangement. The source 14 of the PMOS is connected via a diode 16 to Vcc. The gates of the PMOS 10 and the NMOS 12 are joined as a low true enable 18. When the enable signal 18 is high, the NMOS 12 is on and the PMOS 10 is off. In this state the gate 8 of the bus switch 2 is low thereby keeping the NMOS bus switch 2 off and isolating the node 4 from the node 6. When the signal 18 is low, the NMOS 12 is off, the PMOS 10 is on and the P-rail voltage appears at the gate 8 of the bus switch 2 turning it on connecting nodes 4 and 6. The design parameters of the bus switch 2, with the p-rail voltage at its gate, clamps the highest voltage at the low voltage node 6 when the bus switch is on. In other instances, a reference voltage may be applied to the p-rail, and the clamped voltage at the low voltage node 6 can be programmed by changing the reference voltage. The PMOS 10, NMOS 12 arrangement with a single output and input is a logical inverter with a threshold defined by the structural parameters of the MOSFETs, as is known in the art. For example, the threshold for the PMOS 10, NMOS 12 circuit may be set to about +2.5 volts.

Other translation transceivers are known in the art that pass signals in both directions, but these circuits require a direction signal. The direction input enables the translation switch to pass the signal in a particular direction.

There is a need for a bi-directional bus switch that translates voltage from high to low and from low to high and operates in either direction without needing a direction signal.

SUMMARY

The present invention provides a bi-directional voltage level translating switch that dispenses with a direction signal. The voltage level translating switch includes an NMOS device with the drain connected to higher voltage circuitry and the source to lower voltage level circuitry, although the voltages may be about equal in some applications.

An enable signal via control circuitry drives the gate of the NMOS device turning it on or off. The voltage level supplied by the control circuitry to the gate clamps or limits the voltage level on the source to some voltage that is compatible with the lower voltage circuitry regardless of the voltage on the drain.

Pull up circuit is connected to the drain of the NMOS switch, and provides a connection to the higher voltage supply. A threshold is established for the pull up circuitry that is lower than the lower voltage signal level. When the switch is on and the lower voltage circuitry drives the drain higher beyond the threshold, the pull up circuitry activates and drives the drain to the higher voltage. Again, the source is clamped via the gate control circuitry. When the drain is driven lower beyond the threshold the pull up circuitry is disabled. When the translation switch is on and a lower voltage circuit drives the drain low via an on translation switch, the pull up circuitry is designed so that the lower voltage drive circuit overcomes the pull up circuit capability to drive the drain high. Similarly the higher voltage drive circuitry will overcome the pull up circuits ability to drive the drain high.

Pull up circuitry may be connected to the source of the NMOS transistor to improve its speed. The circuitry will be similar to the pull up circuitry connected to the drain, but connected between the source and the Vccl—the low voltage power supply.

The ability of the higher and lower drive circuitry to drive low and overcome the pull up circuits, can be achieved through the design of a MOS transistor switch in a preferred embodiment of the pull up circuitry. The physical size of that MOS switch can be made small enough, as known in the art, to be overcome by the drive circuits.

In another preferred embodiment, the pull up circuits may include a low impedance path to the higher voltage supply, but that low impedance path is designed to exist for-a given time and then a higher impedance path is provided. The higher impedance path is designed to be overcome and driven low by the drive circuitry connected to either side of the switch.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
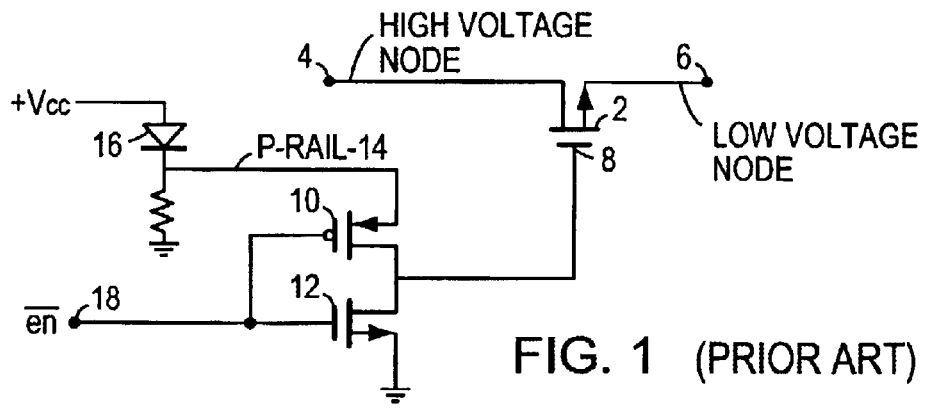
FIG. 1 is a circuit schematic of a prior art translation bus switch.
Figure 2A:
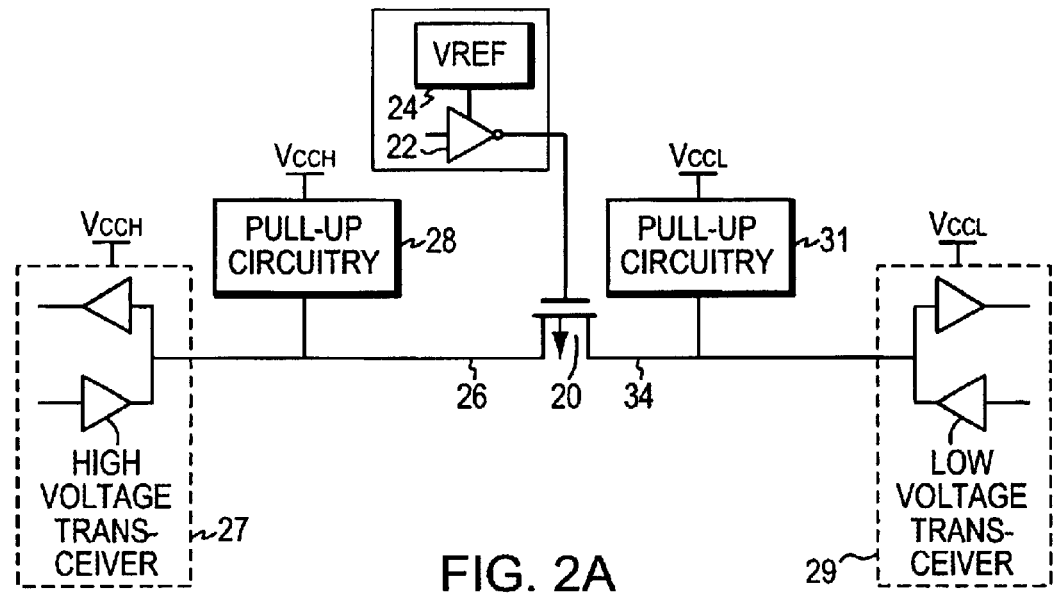
FIGS. 2A and 2B are a schematics of an illustrative circuit showing a preferred embodiment of the present invention.
Figure 2B:
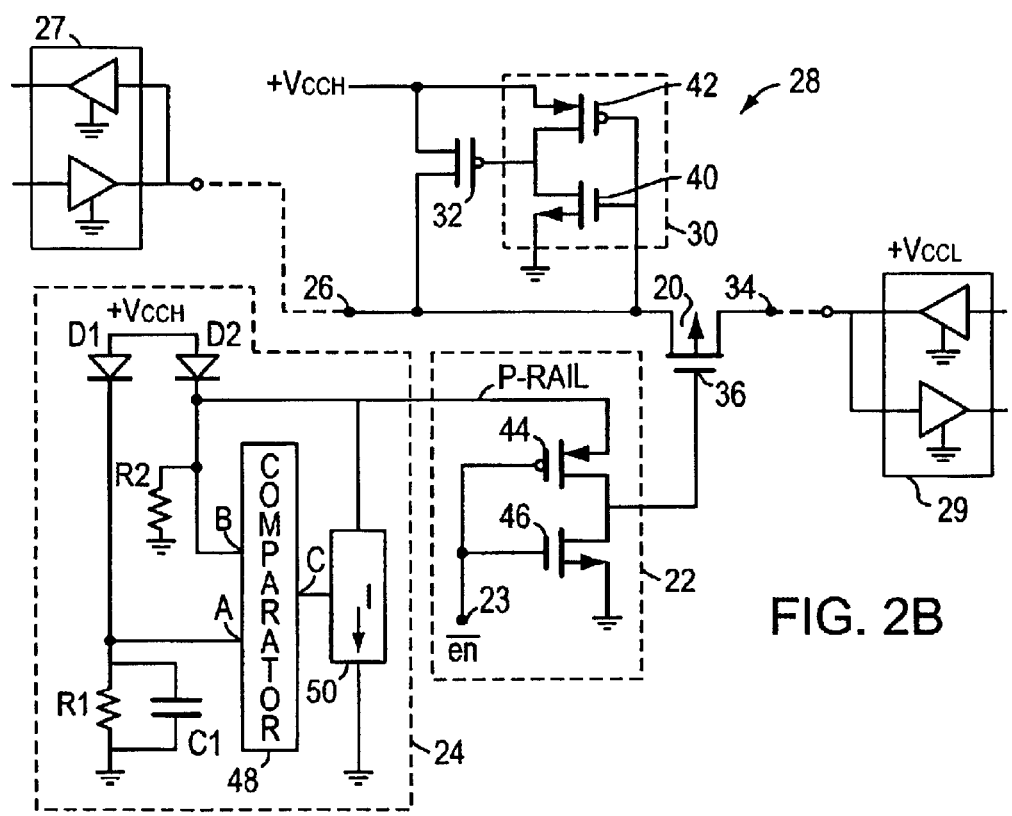

FIGS. 2A and 2B are a preferred embodiments of the present invention. FIG. 2A in a block diagram form and 2B showing one arrangement with more circuit detail. The bus switch 20 and the logic inverter 22 operate as in FIG. 1. The Vref circuit 24 connected to the inverter 22 that drives the gate of NMOS 20. In FIG. 2B, the P-rail (generated from 24) is referred to as the down translation clamp circuit, and acts to clamp the low voltage node 34 when the NMOS 20 is on. The pull up circuits 28 and 31, referred to as the pull up assist circuit, are connected to the high voltage node 26 and the low voltage node 34, respectively, and act to speed up the pull up of these respective nodes.

With respect to FIG. 2B, the pull up assistance circuit 28 contains an inverter 30 comprised of an NMOS 40 and PMOS 42, in a push/pull configuration, driving a PMOS 32. The PMOS 32 source is connected to the Vcch rail and the drain to the high voltage node 26. Consider case 1, with the bus switch 20 biased on and a NAND gate 27 is driving node 26 from ground towards Vcch. The inverter 30 turns on when its threshold is reached and turns on the PMOS 32 which assists driving the node 26 to Vcch. However, the +Vcch voltage does not transfer to the low voltage node 34 because the low voltage node 34 is clamped by the circuit in the gate of the bus switch 36, as discussed below. When the node 26 is driven low past the threshold, the inverter 30 drives the gate of PMOS 32 high, turning off the PMOS 32, and the low voltage is transferred to the low voltage node 34 via the on bus switch. The circuit that drives node 26 lower overcomes the drive capability designed into PMOS 32.

Case 2, with the bus switch 20 biased on and the NAND 29 is driving node 34 from ground towards Vccl. The inverter 30 drives the gate of the PMOS 32 low when the threshold is reached. In a preferred embodiment the threshold is designed to be about one half of the Vccl voltage. The inverter 30 turns on the PMOS 32 that drives node 26 to Vcch. Again, the Vcch on node 26 does not flow back to node 34 again because the gate 36 voltage is clamped. To emphasize this operation the illustrated example provides bus switch with a translation from a low voltage of Vccl volts to a +Vcch without a direction signal In preferred embodiment, the present invention translates between virtually any of the logic power levels. The Vcch and Vccl may be selected from virtually any high and low supply combinations used, for example, but not limited to, Vcch's of +5.0V, or +3.3V, or +2.5V, and Vccl's of +3.3V or +2.5V, or 1.8V. The present invention may be connected between logic power levels that are about equal.

The pull up circuitry 29, shown in FIG. 2A only, is powered from the Vccl supply and is connected to the low voltage node 34, is similar to circuit 28 and operates in an identical manner.

When the node 34 is driven low by tri-stated inverter 29, its drive capability overcomes the pull up capability of the PMOS 32 and the node 26 is driven toward ground. Designing the size and other characteristics of PMOS 32 to operate in this fashion is known in the art. When the node 26 reaches the threshold, the inverter turns off and both nodes 34 and 26 are driven low.

In one example, the three state inverter circuits 27 and 29 that drive and receive signals through the on NMOS 20 sink more than one milliamp at a logic low voltage, and the PMOS 32 is designed to be overcome with about one half milliamp or less. Other values may be designed in other preferred embodiment and other applications. In addition, other bipolar semiconductors and the like may be used in place of the MOSFETS illustrated, and other semiconductors may be used for other active and passive circuit components as are well known in the art.

The inverter 30, the NMOS 40 and PMOS 42, as discussed above and as known in the art, is designed with a threshold within the voltage range exhibited by the low voltage signal range. In other preferred embodiments, the threshold of the NMOS and the PMOS may be different to exhibit some different level triggering and/or other advantageous characteristics, again as known in the art.

Still referring to FIG. 2B, when the enable signal 23 is low, the bus switch is on and the high voltage on the node 34 is clamped by the p-rail voltage on the gate of the bus switch 20 via the PMOS 44. That is, a high voltage at the node 26 will not be transferred to the low voltage node 34 because of the p-rail clamping. The p-rail may be connected to an external reference voltage (not shown) or as a diode D2 drop from Vcch. The p-rail voltage can be set by designers as is known in the art to be compatible with the low level inverter driver 29 connected to node 34.

Still referring to FIG. 2B, the remaining circuitry 24 of D1, RC1, the comparator 48 and the current source or clamp 50 act to protect the low voltage node 34 from over voltage transients. The comparator 48 compares the voltages at its inputs A and B, and in the quiescent or normal state the output C of the comparator gates the current source 50 off. If, however, a high voltage transient appears on node 26, it will be coupled via the drain/gate capacitance of the relatively large bus switch 20 to gate 36. When the PMOS 44 is on, that transient is coupled to the p-rail and the B input to the comparator. This causes the comparator to turn on the current clamp 50 that absorbs the energy in the transient and lowers the voltage on the gate 36, thereby largely preventing the transient from appearing on the node 34.

In the circuit shown in FIG. 2B, the A input to the comparator is diode D1 drop from +Vcch to an R1C1 circuit. C1 may be a reverse biased junction diode. The R1C1 provides a time delay that inhibits any voltage transient appearing on Vcch from appearing at the A input, but allowing the transient to appear at the B input. In another embodiment, the A input voltage may be formed by a reference-type diode, a chain of forward biased diodes, or by some other known low voltage reference circuit. In any case, if a transient appears on the Vcch, the B or p-rail will be driven high, the A input will remain undisturbed for some time at least, and the comparator will turn on the current clamp again acting to prevent the transient from appearing fully on the p-rail and therefore on node 34.

In a preferred embodiment, the Vcch is supplied and the Vccl and the reference voltage are derived from the Vcch. In yet other preferred embodiments, the Vcch, Vccl, and the reference voltage are generated on the chip, or they are all supplied externally.

Figure 3A:
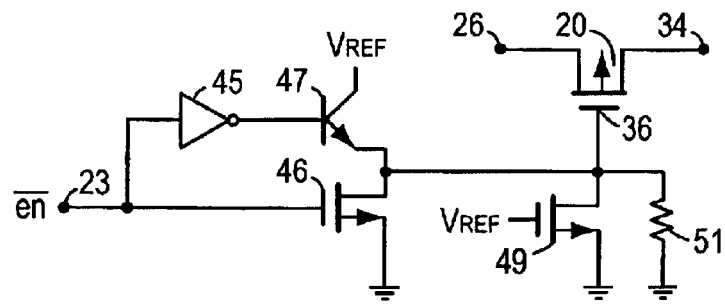
FIGS. 3A and 3B are circuit schematics of a circuit that may be used in gate of a bus switch.

FIG. 3A shows another circuit example suitable for driving the gate 36 of the bus switch 20. Here the PMOS 44(of FIG. 2) is replaced by a logic equivalent of an inverter 45 driving a bipolar NPN transistor 47. When the low active or true enable 23 is low the NPN 37 is on and Vref will appear at the gate 36 turning on the bus switch 20 and clamping the high level at node 34. The resistor 51 and the NMOS 49 acts as a bias current source for the NPN transistor 47. When the low true enable 23 is high NMOS 46 is on turning the switch 20 off.

In a preferred embodiment, the reference voltage is set to the Vccl supply plus the threshold of the pull up circuit 28.

Figure 3B:
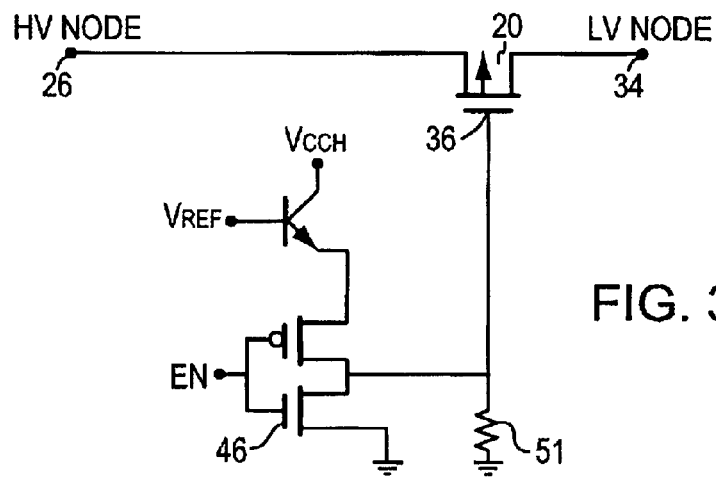

FIG. 3B is another circuit driving the gate of the switch 20. When the low true EN signal is low the NPN and the PMOS transistors are turned on the Vref less the base emitter drop of the NPN transistors is applied to the gate 36 turning on the switch as before. When the EN signal is high, the PMOS is turned off and the NOMS 46 is turned which in turn turns off the switch 20.

Figure 4:
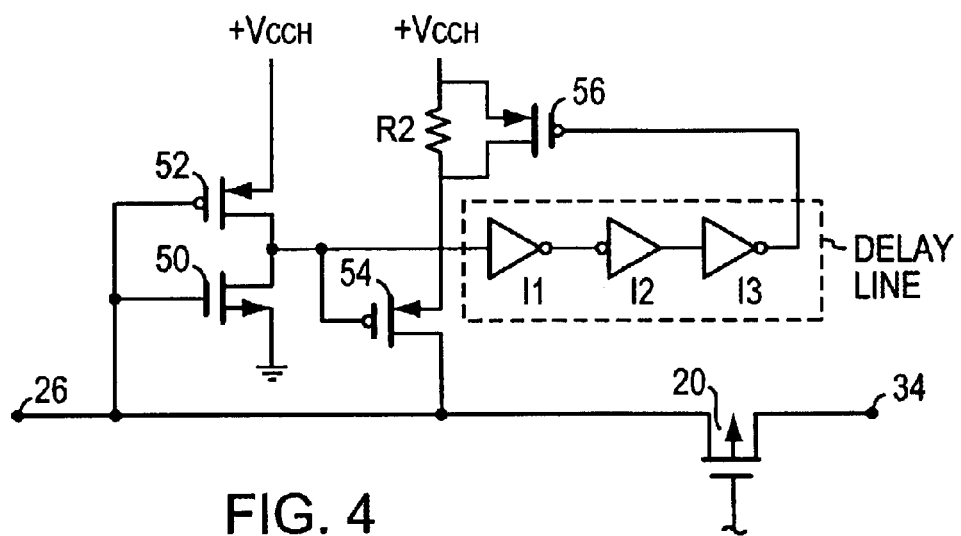
FIG. 4 is a schematic of a circuit that may be used connected to the high voltage node.

FIG. 4 shows another preferred embodiment alternative for circuit 28 of FIG. 2. In FIG. 4, when the node 26 is low or ground NMOS 50 is off and PMOS 52 is biased on. The drain of PMOS 52 and the gate of PMOS 54 are at Vcc biasing PMOS 54 off. The output of inverter I3, the last of the three inverters I1, I2, and I3, is low and PMOS 56 is on driving the source of PMOS 54 to Vcch. As discussed before, the threshold of the inverter formed by 50 and 52 might be designed to be 2 volts. When node 26, that is being driven towards +3.3 volts by NAND 29, reaches the +2.0 volt threshold, NMOS 50 turns on and PMOS 52 turns off. The gate of PMOS 54 lowers to ground turning on PMOS 54. PMOS 54 helps drive the node 26 high with the current supplied via the still on PMOS 56. Inverter I1 is designed with about the same threshold as the inverter of items 50 and 52. So, the output of inverter I3 goes high after the delay of the three inverters turning off PMOS 56. The result is that PMOS 56 provides a higher current drive to help drive node 26 high only during the time period before the output of I3 goes high. After the delay, R2 helps maintain the node 26 at Vcch. As discussed before when node 26 is being driven low by the NAND 29, the drive signal will be able to sink the current from R1 and drive node 26 low. When the threshold of the inverters is reached again, the PMOS 54 is turn off before PMOS 56 is turned on, and the system drive current will be able to drive node 26 low. The thresholds of the I1 inverter may be designed to be at a different level from PMOS 52 and NMOD 50 to enhance the delay through the inverter chain, as is known in the art. Also, as known in the art, the threshold of the other MOSFETS may be different from each other to enhance the operation of the circuit.

Figure 5:
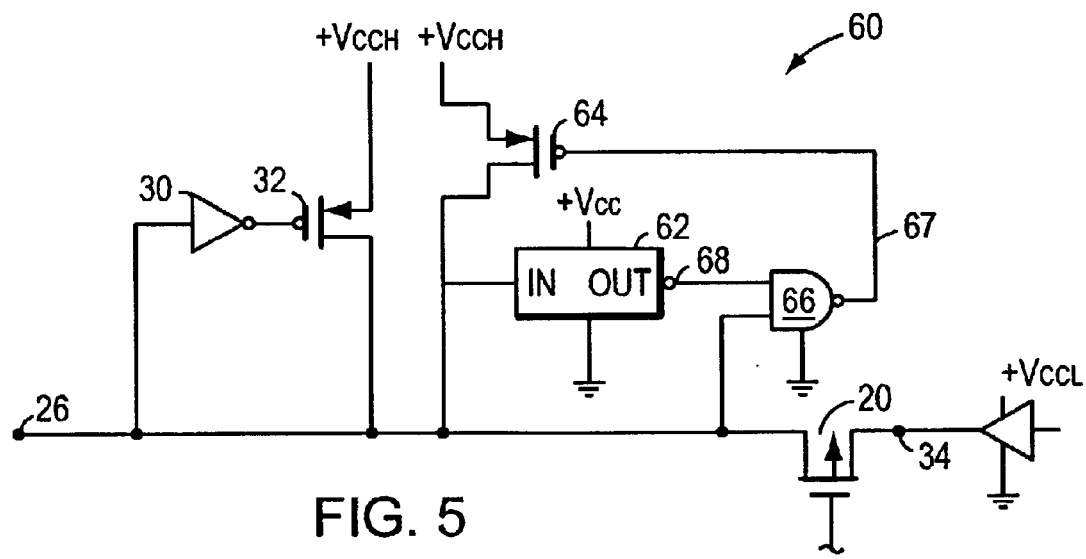
FIG. 5 is another schematic circuit that may be used in place of that of FIG. 4.

Another preferred embodiment of an alternative pull up circuit 28 of FIG. 2A is shown in FIG. 5. Here the PMOS 32 and the inverter 30 are as in FIG. 2, but there is an additional circuit 60. Here PMOS 64 is arranged to supply the added current to transiently help drive the node 26 high. The circuit 62 is designed as a delay (as with an inverter chain). The rising node 26 voltage and the circuit 62 output 68 when the NAND gate 66 threshold is reached drive NAND output 67 and the gate of PMOS 64 low for some given amount of time determined by the design of 62, then the PMOS 64 is turned off by the output 68 going low. When PMOS 64 is off, the NAND 29, as discussed above, can over come the pull up of the PMOS 32 and drive node 26 low. The low on the input to NAND 66 drives its output high maintaining PMOS 64 off regardless of the output of circuit 62. Of course, care must be taken to ensure that the threshold of circuit 62 does not turn on PMOS 64 before the low on node 26 is effective in keeping the NAND output 67 high.

Figure 6:
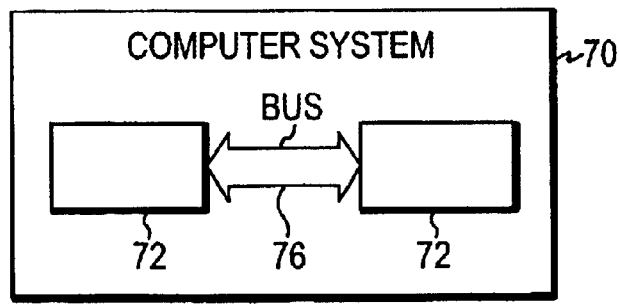
FIG. 6 is a block diagram of computer system using the present invention.

FIG. 6 shows in block form a representative electronic system 70 with a bi-directional bus 76 with translating switches 72 connecting logic portions of a computer system 70. Circuits that connect from a local system to other systems, e.g. communications connections to modems or telephone systems or to remote displays, keyboards, power supplies, memory, etc may advantageously use the bi-directional switch of the present invention.

With respect to the circuit 62, other preferred embodiments may contain level sensitive and/or timing circuitry in many configurations known in the art that enhances the operations of the other circuit elements to advantage.

What is claimed is:

1. An active bi-directional voltage level translation switch joining a higher voltage signal first node to a lower voltage signal second node, the translation switch comprising:

an NMOS switch device with a drain connected to the first node, a source to the second node, and a gate to a control node, an enable signal, a control circuit with an input connected to the enable signal and an output connected to the control node, wherein the enable signal defines two states, a switch on state and a switch off state, a reference voltage connected to the control circuit, wherein, in the switch on state, the reference voltage supply is applied to the control node and clamps the source to a voltage that is compatible with the lower voltage signal, and wherein, in the switch off state, a voltage signal is applied to the control node that turns off the translation switch, a pull up circuit connected from the first node to the higher voltage, the pull up circuit defining a threshold that is lower than the lower voltage, wherein when the drain voltage is higher than the threshold the pull up circuit drives the first node toward the higher voltage, and when the drain voltage is lower than the threshold voltage the pull up circuit is disabled, and when the translation switch is on and a lower voltage circuit drives the first node low via the translation switch, the lower voltage drive circuit overcomes the pull up circuit.

2. The active bi-directional voltage level translation switch of claim 1 further comprising a second pull up circuit connected from the second node to the lower voltage, the second pull up circuit defining a threshold that is lower than the lower voltage, wherein when the source voltage is higher than the threshold the second pull up circuit drives the second node toward the lower voltage, and when the source is lower than the threshold voltage the second pull up circuit is disabled.

3. The active bi-directional voltage level translation switch of claim 1 wherein the reference voltage is derived from one of Vcch or Vccl.

4. The active bi-directional voltage level translation switch of claim 1 wherein Vccl and the reference voltage are derived from Vcch.

5. The active bi-directional voltage level translation switch of claim 1 wherein the Vcch, Vccl and reference voltage are generated on the chip.

6. The active bi-directional voltage level translation switch of claim 1 wherein the higher voltage is selected from the group consisting of +5V, +3.3V, +2.5V, and the lower voltage is selected from the group consisting of +3.3V, +2.5V and +1.8V.

7. An active bi-directional voltage level translation switch joining a higher voltage signal first node to a lower voltage signal second node, the translation switch comprising:

an MOS switch device with a drain connected to the first node, a source to the second node, and a gate to a control node, an enable signal, a control circuit with an input connected to the enable signal and an output connected to the control node, wherein the enable signal defines two states, a switch on state and a switch off state, a reference voltage connected to the control circuit, wherein, in the switch on state, the first voltage supply is applied to the control node and clamps the source to a voltage that is compatible with the lower voltage signal, and wherein, in the switch off state, a voltage signal is applied to the control node that turns off the translation switch, a pull up circuit connected from the first node to the higher voltage, the pull up circuit defining a threshold that is lower than the lower voltage, wherein when the drain voltage is higher than the threshold the pull up circuit connects the first node to the higher voltage through a low impedance for a period of time and then through a high impedance, and when the drain of lower than the threshold voltage the pull up circuit is disabled, wherein when the translation switch is on and a lower voltage circuit drives high impedance low via the first node low through the translation switch.

8. The active bi-directional voltage level translation switch of claim 7 further comprising a second pull up circuit connected from the second node to the lower voltage, the second pull up circuit defining a threshold that is lower than the lower voltage, wherein when the source voltage is higher than the threshold the second pull up circuit drives the second node toward the lower voltage, and when the source is lower than the threshold voltage the second pull up circuit is disabled.

9. The active bi-directional voltage level translation switch of claim 7, wherein the pull up circuit comprises:

a fourth circuit connected from the first node to a third node, the fourth circuit defining a threshold that is lower than the lower voltage, wherein, when the drain voltage is higher than the threshold, the fourth circuit connects the first node to the third node, and when the drain of lower than the threshold voltage the fourth circuit is disabled, a second switch connecting the higher voltage to a third node, a delay circuit connected to and controlling the on off state of the second switch, wherein the delay circuit turns on the second switch when the first node voltage is lower than the threshold, and when the threshold goes higher than the threshold the second switch is turned off after a time delay.

10. An electronic system selected from the group consisting of communications systems, displays, keyboards, power supplies, memory, further comprising a bi-directional voltage translating switch comprising:

an MOS switch device with a drain connected to the first node, a source to the second node, and a gate to a control node, an enable signal, a control circuit with an input connected to the enable signal and an output connected to the control node, wherein the enable signal defines two states, a switch on state and a switch off state, a reference voltage connected to the control circuit, wherein, in the switch on state, the first voltage supply is applied to the control node and clamps the source to a voltage that is compatible with the lower voltage signal, and wherein, in the switch off state, a voltage signal is applied to the control node that turns off the translation switch, a pull up circuit connected from the first node to the higher voltage, the pull up circuit defining a threshold that is lower than the lower voltage, wherein when the drain voltage is higher than the threshold the pull up circuit drives the first node toward the higher voltage, and when the drain of lower than the threshold voltage the pull up circuit is disabled, and when the translation switch is on and a lower voltage circuit drives the first node low through the translation switch, the lower voltage drive circuit overcomes the pull up circuit.

* * * * *